US006215631B1

(12) United States Patent
Fujikata et al.

(10) Patent No.: US 6,215,631 B1
(45) Date of Patent: *Apr. 10, 2001

(54) MAGNETORESISTIVE EFFECT FILM AND MANUFACTURING METHOD THEREFOR

(75) Inventors: Junichi Fujikata; Masafumi Nakada, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/947,875

(22) Filed: Oct. 9, 1997

(30) Foreign Application Priority Data

Oct. 9, 1996 (JP) .................................... 8-268824

(51) Int. Cl.[7] .................................... G11B 5/139
(52) U.S. Cl. ........................................ 360/324.11
(58) Field of Search .................. 360/113, 324.11; 324/207.21, 252; 338/32 R

(56) References Cited

U.S. PATENT DOCUMENTS

| 4,949,039 | 8/1990 | Gruenberg | 324/252 |
| 5,206,590 | 4/1993 | Dieny et al. | 324/252 |
| 5,849,422 | * 12/1998 | Hayashi | 428/611 |
| 5,872,502 | * 2/1999 | Fujikata et al. | 338/32 R |

FOREIGN PATENT DOCUMENTS

| 2-61572 | 3/1990 | (JP) . |
| 4-358310 | 12/1992 | (JP) . |
| 5-347013 | 12/1993 | (JP) . |
| 8-127864 | 5/1996 | (JP) . |
| 9-50611 | 2/1997 | (JP) . |

OTHER PUBLICATIONS

Thompson et al., "Thin Film Magnetoresistors in Memory, Storage, and Related Applications" *IEEE Transactions on Magnetics* 11:1039–1050 (1975).

* cited by examiner

*Primary Examiner*—George J. Letscher
(74) *Attorney, Agent, or Firm*—Foley & Lardner

(57) ABSTRACT

A magnetoresistive effect film has a lamination of an antiferromagnetic thin film, a magnetic thin film that is in contact with the antiferromagnetic thin film, a non-magnetic thin film that is in contact with the magnetic film, and another magnetic thin film that is in contact with the non-magnetic thin film. With a bias magnetic field of Hr on the antiferromagnetic thin film and a coercivity Hc2 of the other magnetic thin film, the condition Hc2<Hr is satisfied. The antiferromagnetic thin film is a laminate of a nickel oxide film and an iron oxide film having a thickness of 20 to 100 Å.

20 Claims, 19 Drawing Sheets

MAGNETORESISTIVE EFFECT FILM AND MANUFACTURING METHOD THEREFOR

BACKGROUND OF THE INVENTION

1. Field of the Invention

The present invention relates to a magnetoresistive effect film which is used in a magnetoresistive effect element which reads the magnetic field strength from a magnetic recording medium or the like as a signal, and more specifically to magnetoresistive effect film that has a large resistance change ratio in a small external magnetic field.

2. Description of Related Art

In recent years, transducers known as MR (magnetoresistive) sensors (or MR heads) have been developed which read data from a magnetic surface with a high linear density.

By means of a reading element, an MR sensor performs detection of a magnetic field signal via a change of resistance, which is a function of the magnetic flux strength and direction.

In an MR sensor Such as this in the past, one component of the resistance of the reading element changed in proportion to the square of the cosine of the angle formed between the direction of the magnetization and the detection current flowing in the element, according to an operating principle known as the anisotropic magnetoresistance (AMR) effect. The AMR effect is discussed in detail in D. A. Thompson et al "Memory, Storage, and Related Applications" IEEE Transactions of Magnetics. MAG-11, p. 1039 (1975).

Additionally, there has recently been a report of a more prominent magnetoresistive effect, whereby the resistance change in a laminated magnetic sensor is attributed to spin dependency transmission between magnetic layers with an intervening non-magnetic layer, and to accompanying spin dependency dispersion at the layer boundary.

This magnetoresistive effect is known by a variety of names, including "giant magnetoresistive effect" and "spin valve effect".

A magnetoresistive sensor such as this is made from an appropriate material, and provides an improvement in density and increase in resistance change when compared to observation by a sensor which uses the AMR effect. With this type of MR sensor, the internal planar resistance between a pair of antiferromagnetic layers that are separated by a non-magnetic layer varies in proportion to the cosine of the angle formed between the magnetization directions in the two layers.

In the Japanese Unexamined Patent Publication No. 2-61572, there is description of a laminated magnetic structure which brings about a large MR effect, that occurs by means of anti-parallel orientation of the magnetization between the magnetic layers.

In the above-noted Japanese unexamined patent application publication, transition metals and alloys thereof are cited as materials that can be used in the magnetic layers in this laminated structure. There is disclosure that FeMn is suitable for use as at least one of two magnetic layers that are separated by a center layer.

In the Japanese Unexamined Patent Publication No. 4-358310, there is a disclosure of an MR sensor having a two layers of thin film ferromagnetic material which are separated by a non-magnetic metallic thin film, in which when the applied magnetic field is zero the magnetization directions in the two ferromagnetic thin films are mutually perpendicular, the resistance between the two non-coupled ferromagnetic layers varying in proportion to the cosine of the angle formed between the magnetization directions in the two layers, this being independent of direction of current flow in the sensor.

In the Japanese Unexamined Patent Publication No. 6-214837, there is a disclosure of magnetoresistive effect element in which, onto a substrate a plurality of magnetic thin films are laminated via an intervening non-magnetic layer, wherein one soft magnetic thin film which adjacently arranged to each other, via an intervening non-magnetic thin film, is provided with an antiferromagnetic thin film, and further wherein in the magnetoresistive effect film in which the bias magnetic field on this antiferromagnetic thin film is Hr and the coercivity of the soft magnetic thin film is Hc2 (<Hr), the above-noted antiferromagnetic thin film is a super lattice selected as at least two types from the group consisting of NiO, NixCo1-x 0, and CoO.

Additionally, in the Japanese Unexamined Patent Publication No. 7-136670 in a magnetoresistive effect film having the same structure as in the Japanese Unexamined Patent Publication No. 6-214837, there is a disclosure of a magnetoresistive effect element that is a two-layer film wherein onto a antiferromagnetic thin film of NiO, is laminated a layer of CoO to a thickness of 10 to 40 Å.

However, in a magnetoresistive effect element in the past such as noted above, the following problems existed.

(1) Although operation is by means of a small external magnetic field, a practically usable sensor or magnetic head must have a signal magnetic field applied in the direction of its easy axis, this leading to the problems that, for use as a sensor, there is no change in resistance exhibited in the area of a zero magnetic field, and that there is a non-linearity occurring due to effects such as the Barkhausen jump.

(2) There is ferromagnetic Interaction between a magnetic layers which neighbor one another via an intervening non-magnetic layer, causing the problem of a shift of linear region of the MR curve away from the zero field.

(3) It is necessary to use a material such as FeMn, which is subject to corrosion, as the antiferromagnetic thin film, making it necessary to take measures in a practically usable device such as using an additive or applying a protective film.

(4) In the case in which a nickel oxide film, which has good resistance to corrosion, is used as the antiferromagnetic thin film, the bias magnetic field is small, and the coercivity of a neighboring soft magnetic film becomes large, leading to the difficulty in achieving magnetization antiparallelness between magnetic layers.

(5) In the case of using a nickel oxide film, the blocking temperature (at which the bias magnetic field is lost) is low, so that if heat treatment is done at 250° C. or above, the bias magnetic field is reduced.

(6) In the case in which an oxide antiferromagnetic film is used as the antiferromagnetic film, oxidation of adjacent soft magnetic films occurs when heat treatment is done, resulting in a reduction of the resistance change ratio in the magnetoresistive effect film.

(7) Because the structure basically obtains a change in resistance by using the change in the mean free path of conducting electrons in a three-layer structure of a magnetic thin film, a non-magnetic thin film and another magnetic thin film, compared with a magnetoresistive effect film known as a coupling type, which has a multiple layer structure, the resistance change ratio is small.

An object of the present invention is to provide a magnetoresistive effect film which exhibits a large linear resistance change in the region of zero magnetic field, and which has good immunity to both corrosion and heat.

A magnetoresistive effect film according to the present invention minimally has a lamination of an antiferromagnetic thin film, a first magnetic thin film (soft magnetic thin film) which makes contact with the above-noted antiferromagnetic thin film, a non-magnetic thin film which makes contact with the first magnetic thin film, and a second magnetic thin film (soft magnetic thin film) which makes contact with the above-noted non-magnetic thin film, wherein if the bias magnetic field of the above-noted antiferromagnetic thin film is Hr and the coercivity of the above-noted second magnetic thin film is Hc2, the equation of Hc2 <Hr should be fulfilled:

The antiferromagnetic thin film, the first magnetic thin film, the non-magnetic thin film, and the second magnetic thin film can be laminated onto a substrate in this sequence, starting with the antiferromagnetic thin film, and an also be laminated onto a substrate in the reverse sequence, starting with the second magnetic thin film. The above-noted antiferromagnetic thin film is a laminate of a nickel oxide film and an iron oxide film having a thickness in the range 20 to 100 Å.

By virtue of the above structure, in comparison with the structure used in the past, there is a prominent improvement in unidirectional anisotropy in the exchange coupling film, and a prominent improvement in thermal stability, thereby enabling the achievement of stable operation of the magnetoresistive effect element.

It is desirable that the thickness of the nickel oxide film be 1000 Å or less. While a greater thickness does not result in a deterioration of the effect, from the standpoint of reading accuracy in the magnetoresistive effect element, this is desirable because of a reduction of accuracy that accompanies an increase in the film thickness.

Because the lower limit of the thickness of the nickel oxide film is greatly influenced by the size of the exchange coupling magnetic field applied to magnetic thin films having neighboring crystalline structures in the antiferromagnetic thin film, it is preferable that this be made 100 Å or greater, at which there is a good crystallization. By forming films onto the substrate by heating it from room temperature to 300° C., crystallization is improved and the bias magnetic field increases.

Films are grown by such methods as vapor deposition, sputtering, molecular beam epitaxy (MBE) and the like. AS the substrate, it is possible to use materials such as quartz glass, Si, MgO, Al2O3, GaAs, ferrite, CaTi2O3, BaTi2O3, and Al2O3-TiC.

In the present invention, by inserting a metal of a thickness of 3 to 30 Å, selected as one or more metals from the group consisting of nickel, iron, and cobalt, between the antiferromagnetic thin film and the magnetic thin film, oxidation of the magnetic thin film is suppressed, and there is also a significant improvement in the reduction in the exchange coupling magnetic field when heat treating and in a reduction of the resistance change ratio.

In the present invention, by making the surface roughness of the antiferromagnetic thin film 2 to 15 Å, there is a change in the magnetic domain structure in the magnetic thin film laminated thereover, this causing a reduction in the coercivity of the exchange coupling film.

It is preferable that the material used for the magnetic thin film in the present invention be one or more metals selected from a group consisting of Ni, Fe, Co, FeCo, NiFe, and NiFeCo. By doing this, a large dispersion of conduction electrons occurs in the boundary between the non-magnetic thin film and the magnetic thin film, thereby achieving a large resistance change.

In the present invention, a magnetic thin film is formed from above-noted magnetic materials. In particular, the implementation of the present invention is made possible by selecting a material for which the anisotropic magnetic field Hk2 of the magnetic film which is not adjacent to the antiferromagnetic thin film is greater than the coercivity Hc2.

The anisotropic magnetic field can also be made large by making the film thickness small. For example, if a NiFe film is made to a thickness of approximately 10 Å, it is possible to make the anisotropic magnetic field Hk2 larger than the coercivity Hc2.

Additionally, it is possible to manufacture the above-noted magnetoresistive effect element so that the easy magnetization axis of the magnetic thin film is perpendicular with respect to the direction of the applied signal magnetic field, and so that the coercivity of the magnetic thin film in the direction of the signal magnetic field is such that Hc2<Hk2<Hr, by forming the magnetic thin film within a magnetic field.

Specifically, the applied magnetic field is rotated by 90 degrees during the formation of film, so that the easy axis of the magnetic thin film which is adjacent to the antiferromagnetic thin film is perpendicular to the easy magnetization direction of magnetic thin film that is neighboring thereto via an intervening non-magnetic film, or alternately to rotate the substrate by 90 degrees in the magnetic field.

It is desirable that the thickness of each magnetic thin film be 150 Å or less. If the film thickness is made larger than 150 Å, accompanying the increase in film thickness there is an increase in the region that does not contribute to electron dispersion, resulting in a reduction in the giant magnetoresistive effect.

While there is no particular lower limit to the thickness of the magnetic thin films, at a thickness below 10 Å, there is a large surface dispersion of conduction electrons, resulting in a reduction in the magnetoresistive change.

If the thickness is made 10 Å or greater, it is easy to maintain a uniform film thickness, and good characteristics are achieved. Additionally, there is no problem of the saturation magnetization becoming small.

The coercivity of a magnetic thin film which is adjacent to an antiferromagnetic thin film can be made small by raising the substrate temperature from room temperature to 300° C. and continuously forming it continuously with the antiferromagnetic thin film.

In addition, by inserting Co, FeCo, NiCo, or NiFeCo at the boundary between the magnetic thin film and the non-magnetic thin film, the probability of conduction electron boundary dispersion is increased, thereby enabling achievement of a large resistance change, The lower limit of the inserted thin film is 3 Å. At below this, there is not only a reduced effect of insertion, but also it becomes difficult to control the growth of the film.

While there is no particular upper limit on the thickness of the inserted film, it is desirable that this be approximately 40 Å.

At greater than this, hysteresis occurs in the output in the operation range of the magnetoresistive effect element.

Additionally, in a magnetoresistive effect element such as this, by bringing a permanent magnet thin film into proximity in the easy magnetization direction of the magnetic thin film which detects the external magnetic field, that is, the magnetic field which is not adjacent to the antiferromagnetic thin film, it is possible to achieve stabilization of magnetic domains, and to avoid non-linear output such as caused by a Barkhausen jump. It is preferable to use a material such as CoCr, CoCrTa, CoCrTaPt, CoCrPt, CoNiPt, CoNiCr, CoCrPtSi, or FeCoCr as the material for the permanent magnet thin film. It is also possible to use Cr or the like as a base layer for these permanent magnet thin films.

The non-magnetic thin film is a material which serves the purpose of weakening the magnetic coupling between magnetic thin films and, to achieve high resistance change and immunity to heat, it is desirable that this be made of one or more metals from the group consisting of Cu, Au, Ag, and Ru.

From experiments, it is desirable that the thickness of the non-magnetic thin film be in the range from 20 to 35 Å.

In general, if the film thickness exceeds 40 Å, the resistance is established by the non-magnetic thin film, the dispersion effect which is dependent upon spin becoming relatively small, this resulting in a small magnetic resistance change ratio.

If the film thickness is greater than 20 Å, the magnetic interaction between magnetic thin films becomes excessively great, and it becomes impossible to avoid the occurrence of the direct magnetic contact condition (pinholes), resulting in a condition in which the magnetization directions of the magnetic thin films are different.

In a spin valve film which uses an oxide antiferromagnetic thin film such as in the present invention, because there is a mutual interaction between magnetic thin films with respect to the thickness of the non-magnetic thin film, with the thickness of the non-magnetic thin film in the region from 8 to 12 Å, the two magnetic thin films are antiferromagnetically coupled, resulting in a large resistance change in the region near zero magnetic field.

The thickness of the magnetic thin film or the non-magnetic thin film can be measured, for example, by a transmission-type electron microscope, a scanning-type electron microscope, or by Auger electron spectroscopy.

The crystallization structure of the thin film can be verified by such means as X-ray diffraction or high-speed electron beam diffraction.

When configuring a magnetoresistive effect element, there is no particular restriction to the number of lamination repetitions N of an artificial matrix film, it being possible to establish this in accordance with the desired magnetic resistance change ratio.

However, because the antiferromagnetic thin film resistivity is large, resulting in loss of lamination effect, it is preferable that this structure be replaced by a antiferromagnetic layer/magnetic layer/non-magnetic layer/magnetic layer/non-magnetic layer/magnetic layer/antiferromagnetic layer structure.

The surface of the uppermost magnetic thin film does not need to be provided with an oxidation preventing film of silicon nitride, silicon oxide, alumina or the like, and it is possible to provide a metallic conductive layer for the purpose of Making wiring connections to electrodes.

Because it is not possible to directly measure the magnetic characteristics of the magnetic thin films that exist within the magnetoresistive effect element, the measurement is usually made as follows.

The magnetic thin film to be measured is formed in a measurement sample, with alternate films of this film and a non-magnetic thin film grown so as to reach a total thickness of 500 to 1000 Å, the magnetic characteristics of this laminate being then measured. In this case, the thickness of the magnetic thin film, the thickness of the non-magnetic thin film, and the composition of the non-magnetic thin film are the same as used in the magnetoresistive effect element.

Using a magnetoresistive effect element according to the present invention, an antiferromagnetic thin film is formed so as to be adjacent to the first magnetic thin film, so that an exchange bias inevitably operates.

The reason for this is that the principle of the present invention is based on the fact that when the directions of magnetization of magnetic thin films which are adjacent via an intervening non-magnetic thin film are mutually opposite, the maximum resistance is exhibited.

That is, according to the present invention, as shown in FIG. 3, when the external magnetic field H has a magnitude that falls between the anisotropic magnetic field Hk2 of the second magnetic thin film and the anti-magnetic force, i.e., bias magnetic field, Hr of the first magnetic thin film, that is when the condition Hk2<H<Hr is satisfied, the directions of magnetization in adjacent magnetic thin films are mutually opposite, resulting in an increase in resistance.

FIG. 2 is an exploded perspective view which shows an example of an MR sensor which uses an magnetoresistive effect element according to the present invention.

This MR sensor, as shown in FIG. 2, is formed from an artificial lattice films 7 that is formed on the substrate 4, in which on top of an antiferromagnetic thin film 5 that is formed on the substrate 4, there are formed magnetic thin films 3 and 2, with an intervening non-magnetic thin film 1, this magnetic thin films 2 and 3 having mutually perpendicular easy magnetization directions, a signal magnetic field which is released from the magnetic recording medium 8 being established so as to be perpendicular to the easy magnetization direction of the magnetic thin film 2.

In this arrangement, the magnetic thin film 3 has imparted to it unidirectional anisotropy by the antiferromagnetic thin film 5 which is adjacent thereto.

Because the magnetization direction of the magnetic thin film 2 rotates in response to the magnitude of the signal magnetic field from the magnetic recording medium 8, the resistance changes and the magnetic field is thereby sensed.

Next, the relationship between the external magnetic field, the coercivity, and the magnetization direction will be described. As shown in FIG. 3, the anti-magnetic force, i.e., bias magnetic field, or the magnetic thin film 3, which is exchange biased, is Hr, the coercivity of the magnetic thin film 2 is Hc2, and the anisotropic magnetic field is Hk2 (where 0<Hk2<Hr).

At first, the external magnetic field B is applied so that H<-Hk2, (region (A)). Under this condition, the magnetization directions of the magnetic thin films 2 and 3 are the same as H (negative direction).

Next, as the external magnetic field is weakened, under the condition—Hk2<H<Hk2 (region (B)), the magnetization of the magnetic thin film 2 rotates so as to reverse to the positive direction, and when Hk2<H<Hr (in region (C)), the magnetization directions of the magnetic thin films 2 and 3 are mutually opposite.

When the external Magnetic field H is further increased so that Hr<H (region (D)), the magnetization direction of the magnetic thin film 3 also reverses, so that the magnetization directions of both magnetic thin film 2 and magnetic thin film 3 are positive.

As shown in FIG. 4, the resistance of this film varies in response to the relative magnetization directions of magnetic thin films 2 and 3, this varying linearly in the region of zero magnetic field, the maximum value Rmax being exhibited in region (C).

DETAILED DESCRIPTION OF THE PREFERRED EMBODIMENTS

Figure 1:
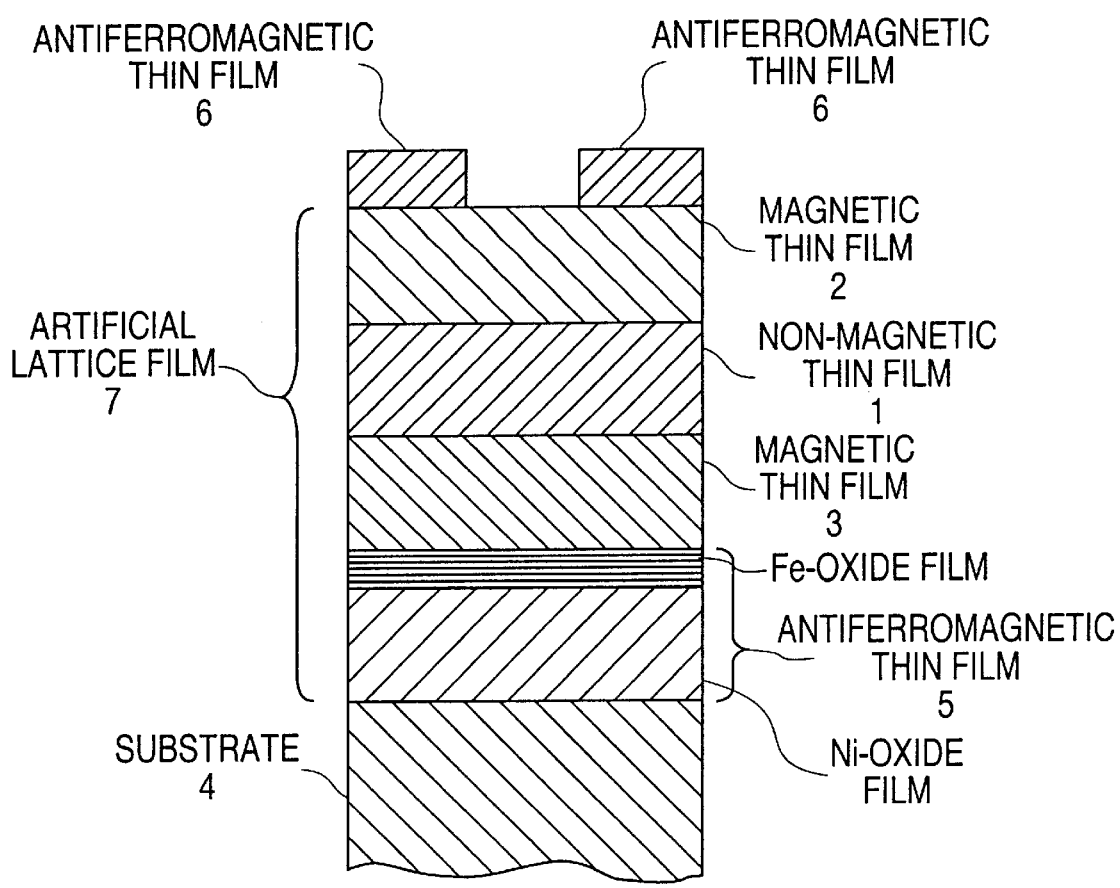
FIG. 1 is a partially simplified cross-sectional view which shows an embodiment of a magnetoresistive effect film according to the present invention.
Figure 2:
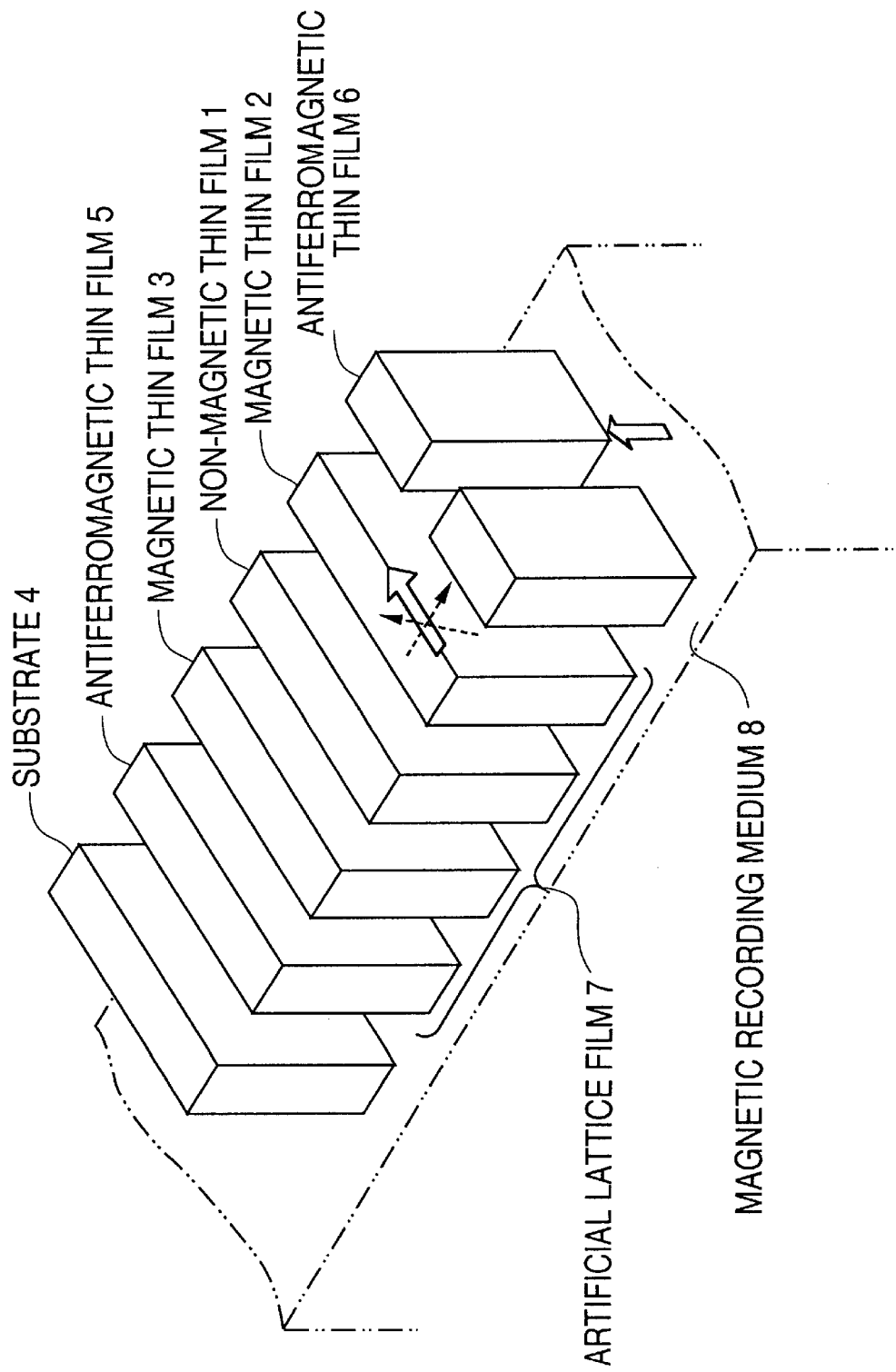
FIG. 2 is an exploded perspective view of a magnetoresistive sensor formed by the magnetoresistive effect film which is shown in FIG. 1.
Figure 3:
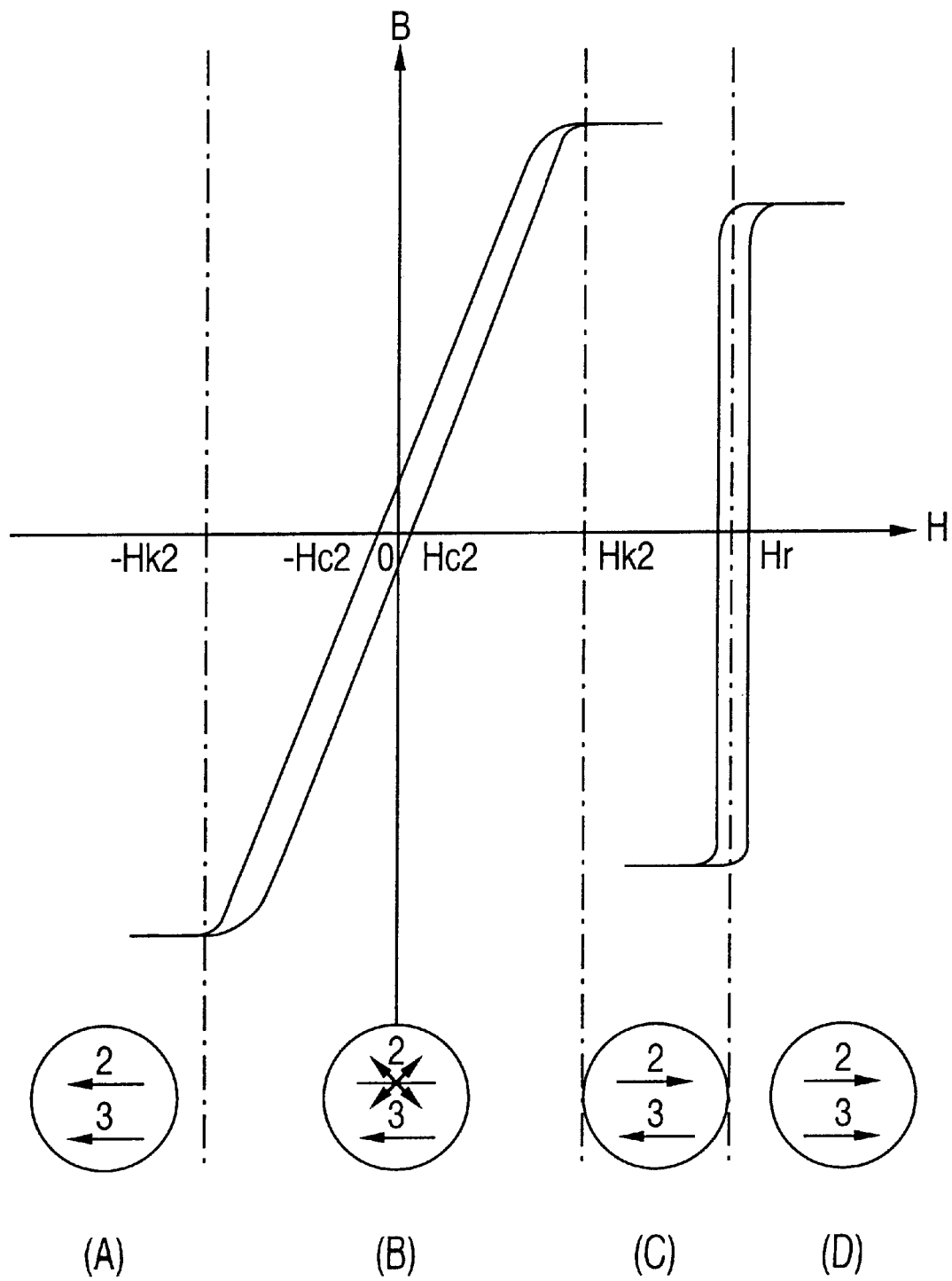
FIG. 3 is a graph which shows the B-H curve of the magnetoresistive effect film which is shown in FIG. 1.
Figure 4:
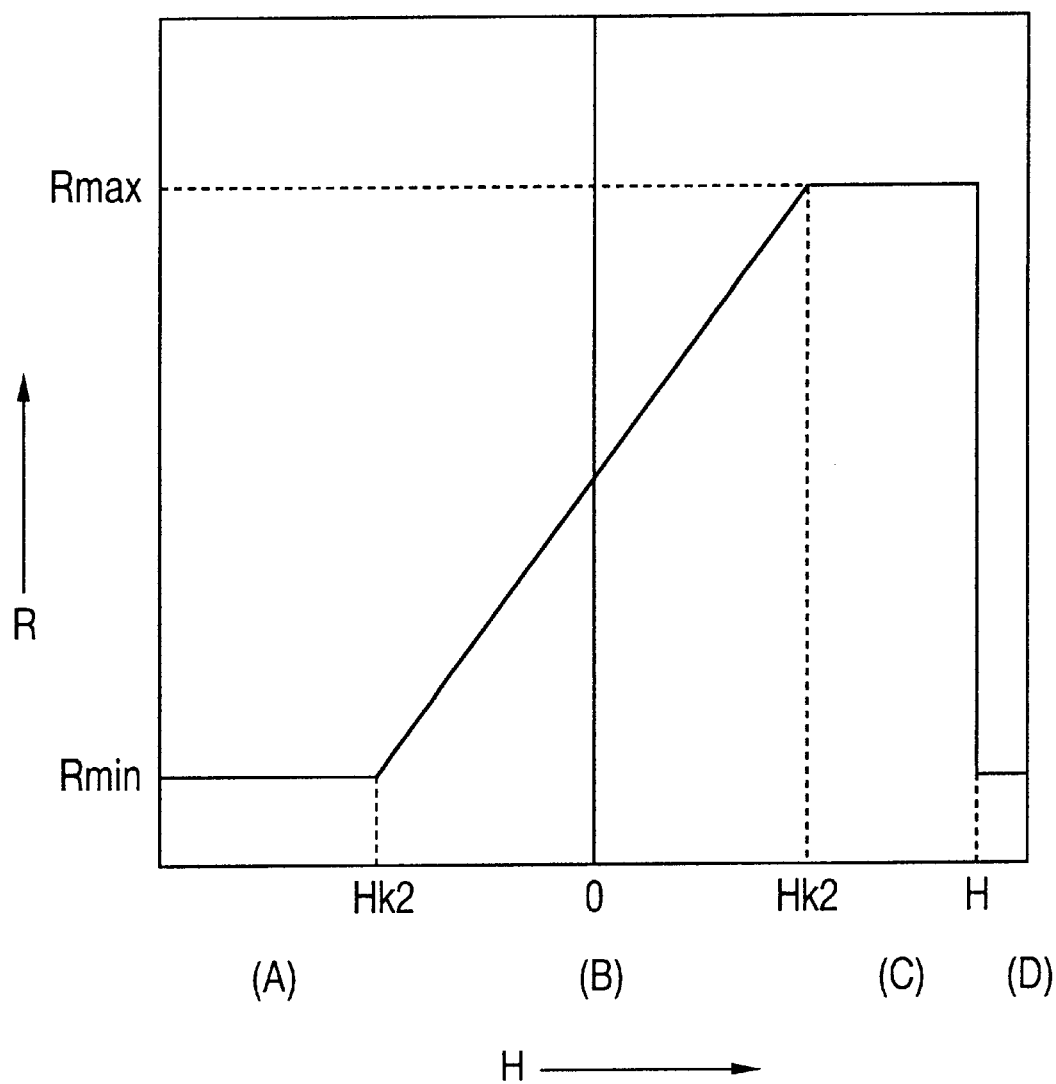
FIG. 4 is a graph which shows the R-H curve of the magnetoresistive effect film which is shown in FIG. 1.
Figure 5:
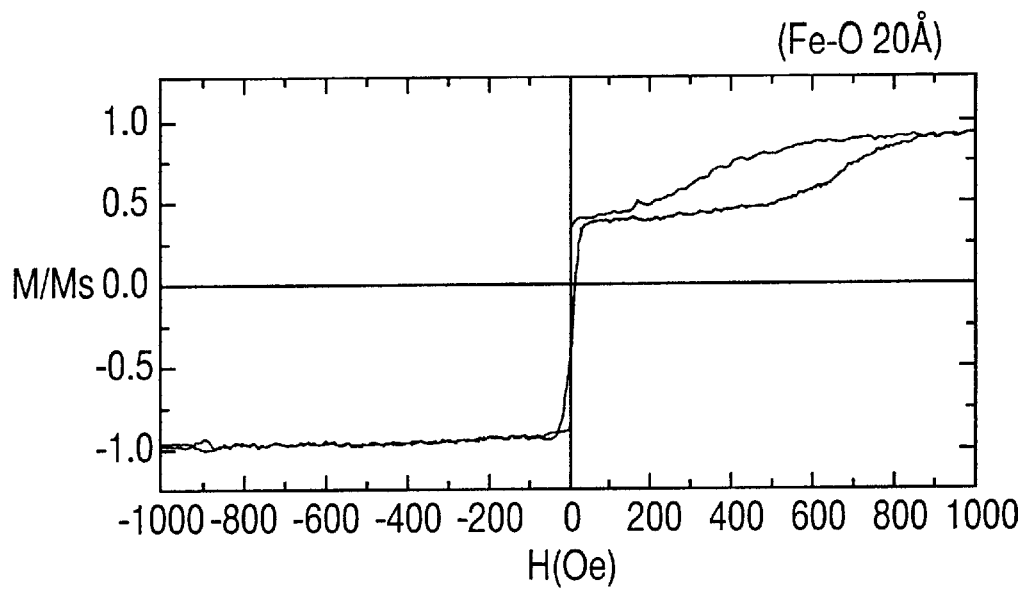
FIG. 5 is a graph which shows the B-H curve of the magnetoresistive effect film which is shown in FIG. 1.
Figure 6:
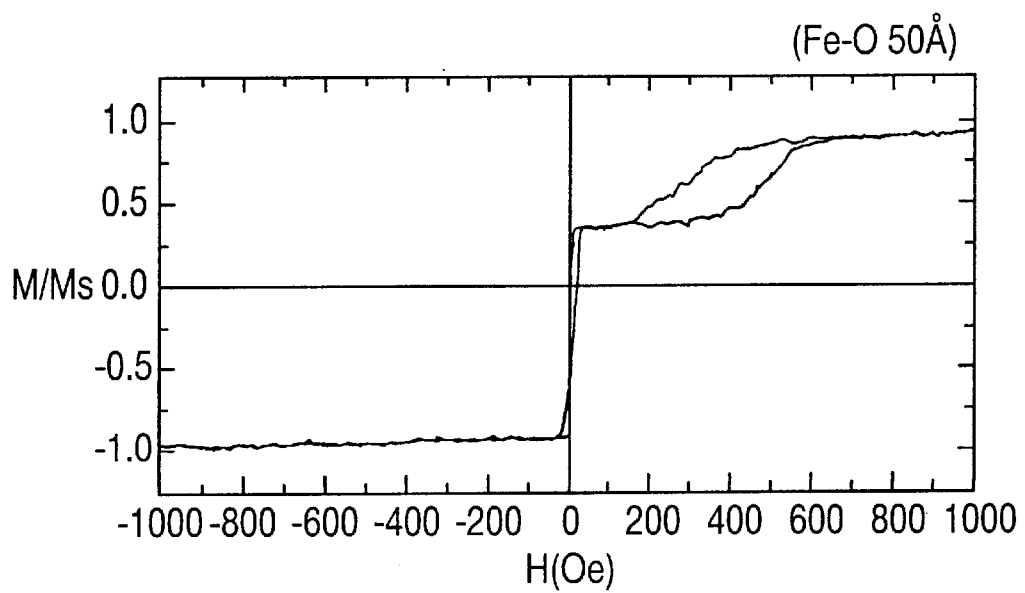
FIG. 6 is a graph which shows the B-H curve of the magnetoresistive effect film is in FIG. 1.
Figure 7:
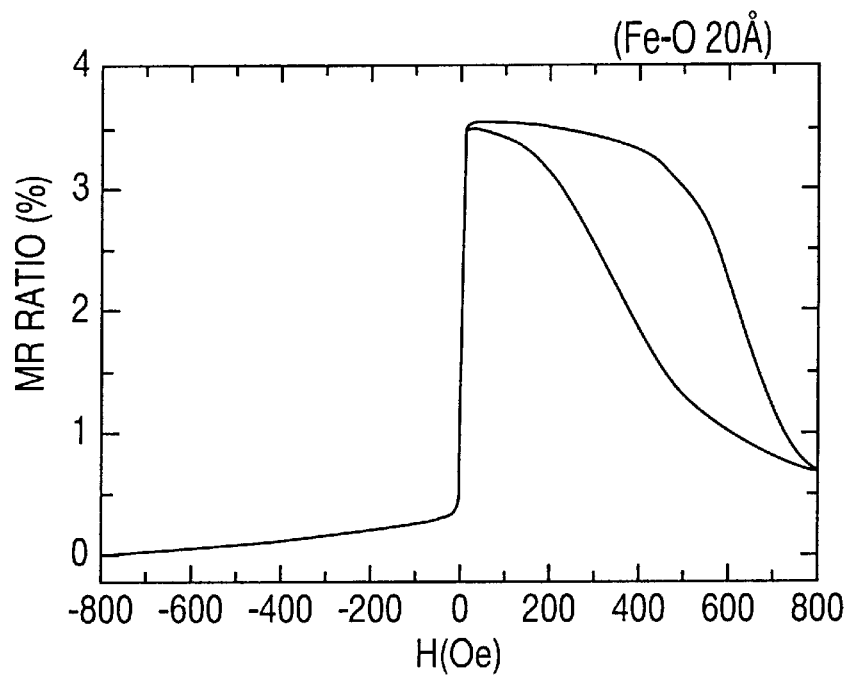
FIG. 7 is a graph which shows the MR curve of the magnetoresistive effect film which is shown in FIG. 1.
Figure 8:
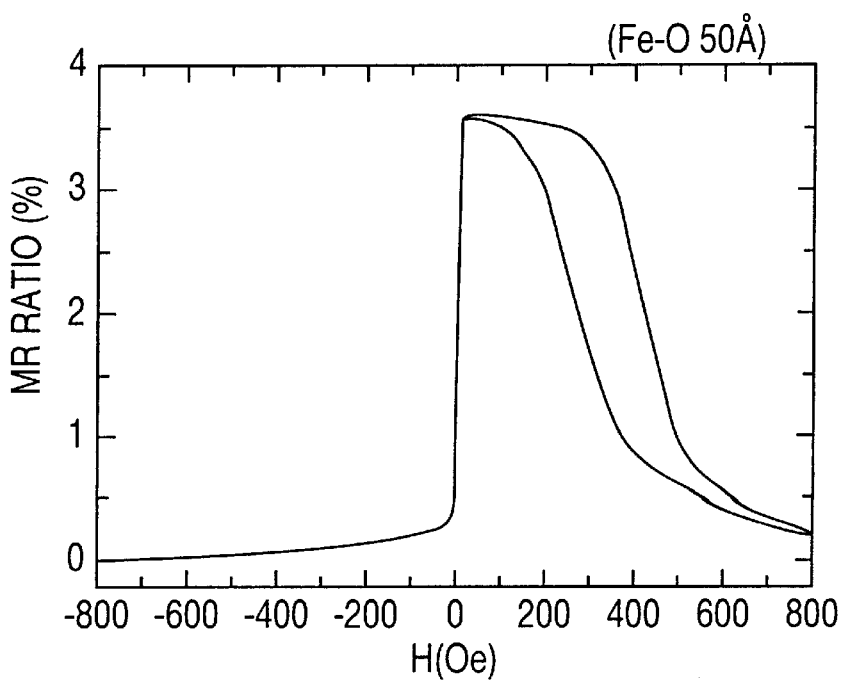
FIG. 8 is a graph which shows the MR curve of the magnetoresistive effect film which is shown in FIG. 1.

FIG. 1 is a drawing which shows an embodiment of the present invention, this being shown with enlargement in the film thickness direction, an artificial lattice film 7 being used in this case as the magnetoresistive effect film.

The artificial lattice 7 has magnetic thin films 2 and 3 formed on the an antiferromagnetic thin film 5, preferably comprising a Fe-oxide film and an Ni-oxide film, a non-magnetic thin film 1 being disposed between the adjacent magnetic thin films 2 and 3. The magnetic thin film 2 has formed on it the antiferromagnetic thin films (or permanent magnet thin films) 6. The materials and other particulars set forth in the claims will be described below, based on the results of experiments.

A glass plate, to serve as the substrate 4, is placed in a vacuum apparatus, a vacuum is drawn to the order of 10–7 Torr. The substrate temperature is maintained at from room temperature to 300° C., and on the substrate are grown an NiO film of thickness 100 to 1000 Å, an FeO thin film of thickness from 10 to 100 Å, and then a magnetic thin film (of NiFe, Co. FeCo, NiCO, or NiFeCo).

After forming an exchange coupling film as noted above at a temperature from room temperature to 300° C. the substrate temperature is returned to room temperature, and the non-magnetic and magnetic layers are formed.

When doing this, the applied magnetic field during film growth is rotated by 90 degrees, so that the easy magnetization axis of the exchange coupling film and that of the magnetic layer which is adjacent thereto via an intervening non-magnetic layer are mutually perpendicular.

Then, this artificial lattice film is place in a heating oven, and heat treated at a temperature of 200 to 300° C. while applying a DC magnetic field of 300 to 3000 Oe in the easy magnetization direction of the exchange coupling film, thereby forming the magnetoresistive effect film.

More specifically, the growth of films is done by placing an NdFeB magnet at both ends of the glass substrate, and by applying an external magnetic field of approximately 3000 Oe in parallel to the glass substrate.

A measurement of the B-H curve of this sample shows that the direction of application of the magnetic field during film growth is the easy magnetization axis of the magnetic thin film.

Then, the artificial matrix film indicated below was formed at a rate of 2.2 to 3.5 Å/second for the oxide antiferromagnetic thin film, and a rate of approximately 0.8 to 2.0 Å/second for the magnetic thin film and non-magnetic thin film.

In the following, the notation NiO(500)/Fe—O(20)/NiFe (60)/Cu(25)/NiFe(60) would mean the sequential lamination onto the substrate of an NiO thin film of a thickness of 500 Å and an Fe—O thin film having a thickness of 20 Å, so as to form the antiferromagnetic thin film, after which a Ni80%-Fe20% alloy thin film having a thickness of 60 Å, a Cu thin film having a thickness of 25 Å, and a Ni80%-Fe20% thin film having a thickness of 60 Å are sequential grown.

The measurement of magnetization %as performed using an oscillating magnetization meter. The resistance measurement was performed by fabricating a sample measuring 1.0 by 10 mm², and using a four-wire resistance measurement to perform the measurement while varying the external magnetic field from −500 to 500 Oe so that the field within the surface is perpendicular to the current flowing therein, the magnetic resistance change ratio Δ R/R being determined. The maximum and minimum values of the resistance change ratio Δ R/R represented as Rmax and Rmin, respectively, this change ratio was calculated by the equation Δ R/R= (Rmax−Rmin)/Rmin×100%.

The fabricated spin valve films were composed as indicated below.

<1> Non-magnetic layer Cu glass/NiO(150 to 500)/Fe—O(20 to 100)/Co90Fe10(20 to 150)/Cu(8 to 40)/NiFe(20 to 150)

<2> Magnetic fixed layer Co90Fe10 glass/NiO(150 to 500),/Fe—O(20 to 100)/Co90Fe10(20 to 150)/Cu(8 to 40)/NiFe(20 to 150)

<3> Non-magnetic layer Au glass/NiO(150 to 500)/Fe—O(20 to 100)/NiFe(20 to 150)/Au(8 to 40)/NiFe(20 to 150)

<4> Non-magnetic layer Ag glass/NiO(150 to 500)/Fe—O(20 to 100)/NiFe(20 to 150)/Au(8 to 40)/NiFe(20 to 150)

<5> Non-magnetic layer Ru glass/NiO(150 to 500)/Fe—O(20 to 100)/NiFe(20 to 150)/Au(8 to 40)/NiFe(20 to 150)

<6> Non-magnetic layer Cu1-xAgx glass/NiO(150 to 500)/Fe—O(20 to 100)/NiFe(20 to 150)/Cu1-xAgx(8 to 40)/NiFe(20 to 150)

<7> Oxidation preventing layer thickness storage samples
(a) glass/NiO(150 to 500)/Fe—O(20)/Fe(3 to 30)/NiFe(20 to 150)/Cu(8 to 40)/NiFe(20 to 150)
(b) glass/NiO(150 to 500)/Fe—O(20)/Ni(3 to 30)/NiFe(20 to 150)/Cu(8 to 40)/NiFe(20 to 150)
(c) glass/NiO(150 to 500)/Fe—O(20)/Co(3 to 30)/NiFe(20 to 150)/Cu(8 to 40)/NiFe(20 to 150)
(d) glass/NiO(150 to 500)/Fe—O(20)/FeCo(3 to 30)/NiFe(20 to 150)/Cu(8 to 40)/NiFe(20 to 150)
(e) glass/NiO(150 to 500)/Fe—O(20)/NiCo(3 to 30)/NiFe(20 to 150)/Cu(8 to 40)/NiFe(20 to 150)

Figure 9:
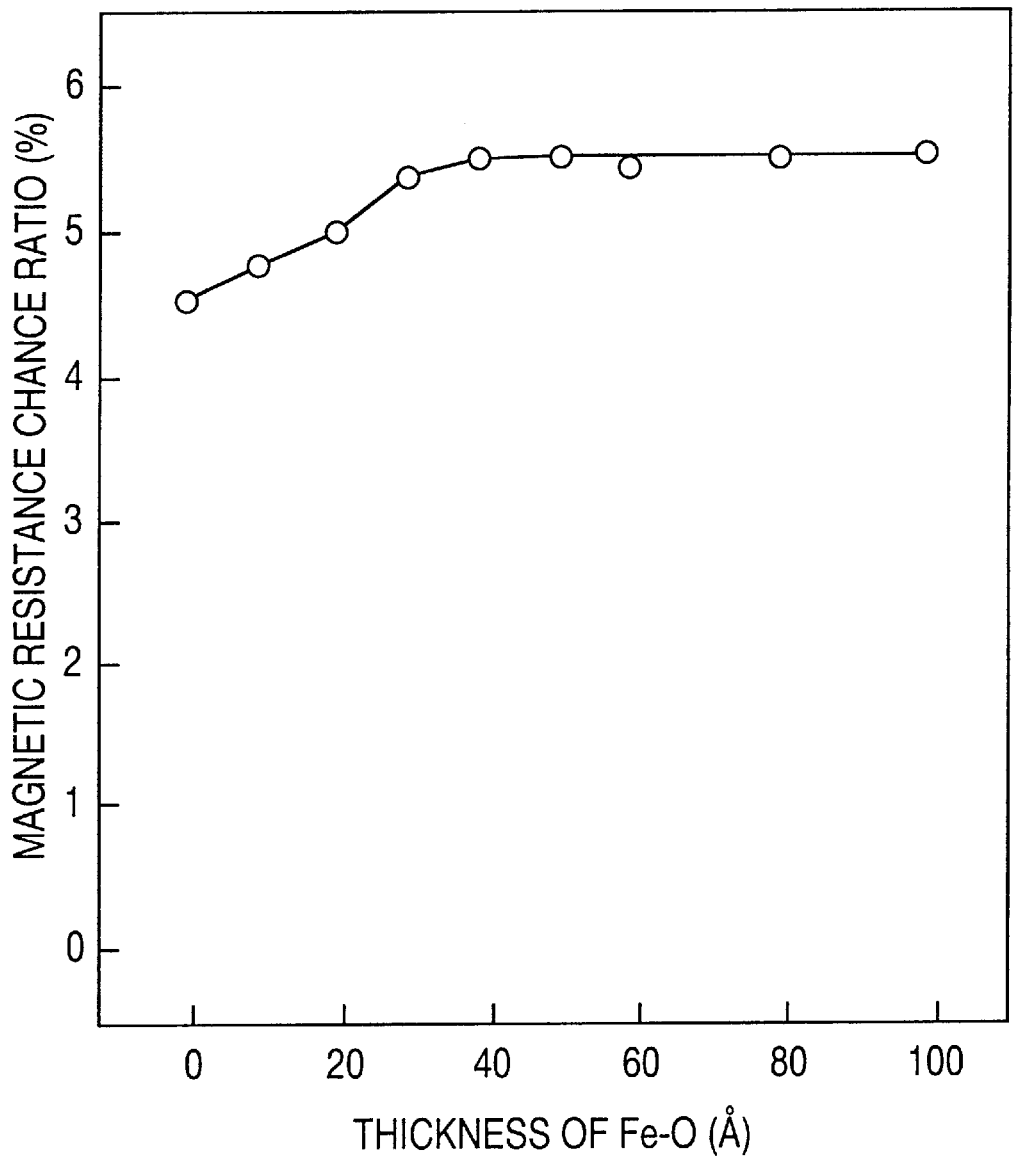
FIG. 9 is graph which shows the dependency of the resistance change ratio on the Fe-O layer thickness in the magnetoresistive effect film which is shown in FIG. 1.

FIG. 9 shows the dependency of the resistance change ratio on the thickness of the Fe—O layer.

It can be seen that by laminating a thin film layer of Fe—O to a thickness of 20 to 100 Å over the nickel oxide film, the resistance change ratio increases gradually.

Figure 10:
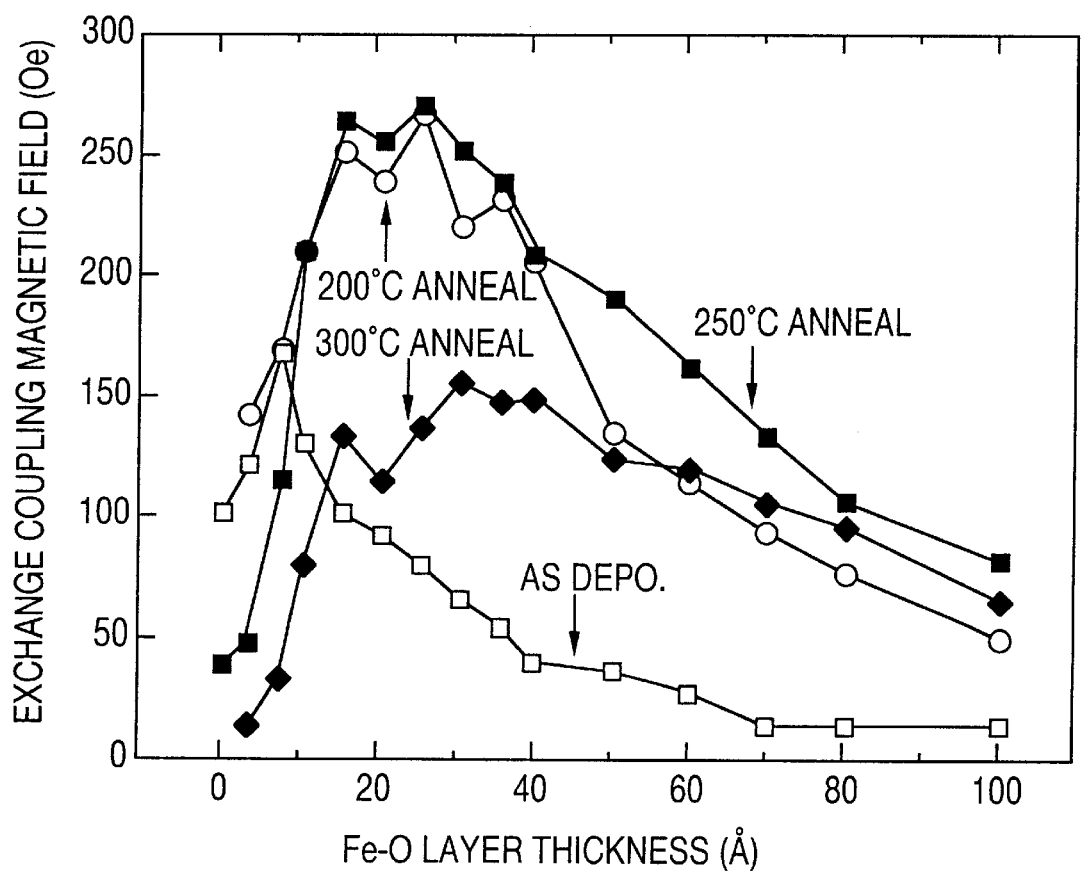
FIG. 10 is a graph which shows the dependency of the exchange coupling magnetic field on the Fe-O layer thickness in the magnetoresistive effect film which is shown in FIG. 1.

FIG. 10 shows the dependency of the exchange coupling film exchange coupling magnetic field for NiO (500 Å)/Fe—O/Ni—Fe (60 Å) on the thickness of the Fe—O layer and the heat treating temperature. The exchange coupling magnetic field increases by heat treating at a temperature of approximately 250° C., and is maximum in the thickness range 10 to 30 Å.

Thus, by laminating an Fe oxide layer over the nickel oxide film, there is a prominent improvement in the immunity to heat of the exchange coupling film, as well as a great increase in the exchange coupling magnetic field.

When the crystalline structure of the iron oxide film has α-Fe2O3 as its major component, a blocking temperature of the exchange coupling layer will be increased reducing the operation of the magnetoresistive effect film stable in high temperature.

On the other hand, when the crystalline structure of said iron oxide film has FeO as its major component, an anisotropy of the antiferromagnetic thin film will be increased and thus a relatively large amount of exchange coupling magnetic field of the exchange coupling layer can be obtained/

Figure 11:
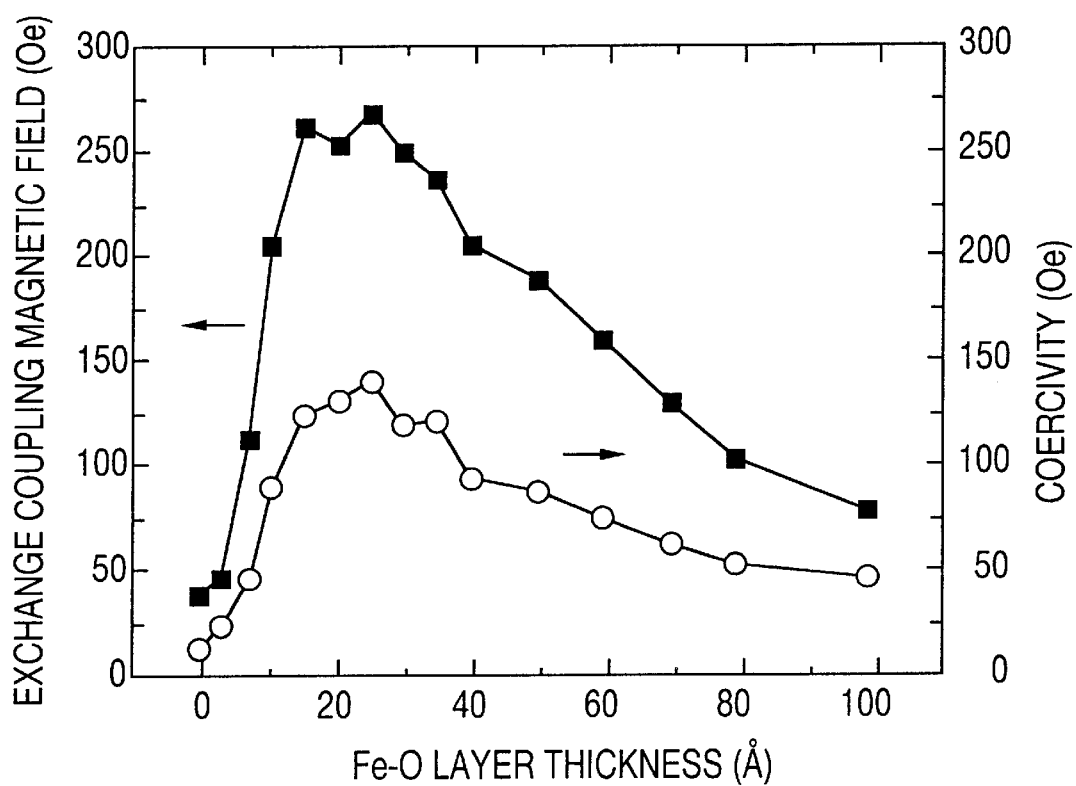
FIG. 11 is a graph which shows the dependency of the exchange coupling magnetic field and coercivity on the Fe-O layer thickness in the magnetoresistive effect film which is shown in FIG. 1.

FIG. 11 shows the dependency of the exchange coupling film exchange coupling magnetic field the film of which had been thermally treated with 250° C., for 2 hours, and coercivity on the thickness of the Fe—O layer, from which it is seen that for both samples coercivity is approximately ½ of the exchange coupling magnetic field, and that there is no hysteresis exhibited in the operation of the magnetoresistive effect element.

Figure 12:
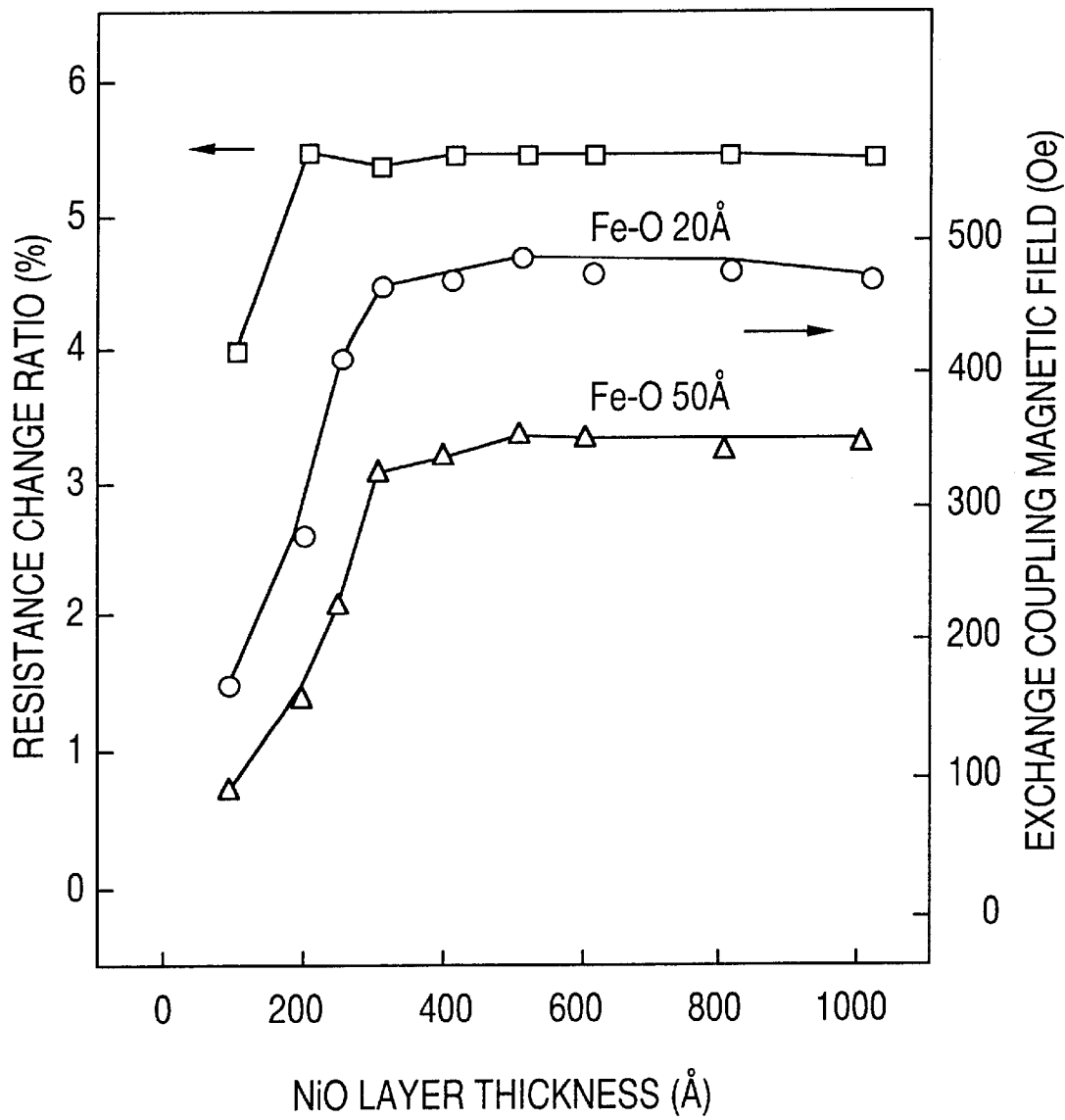
FIG. 12 is a graph which shows the dependency of the resistance change ratio and exchange coupling magnetic field on the thickness of the NiO layer in the magnetoresistive effect film which is shown in FIG. 1.

FIG. 12 shows the dependency of the resistance change ratio and the exchange coupling magnetic field on the thickness of the NiO layer. While there is almost no influence on the resistance change ratio by the NiO layer thickness, the exchange coupling magnetic field is greatly influenced by the NiO layer thickness. That is, it is necessary for the NiO layer thickness to be at least 150 Å.

Figure 13:
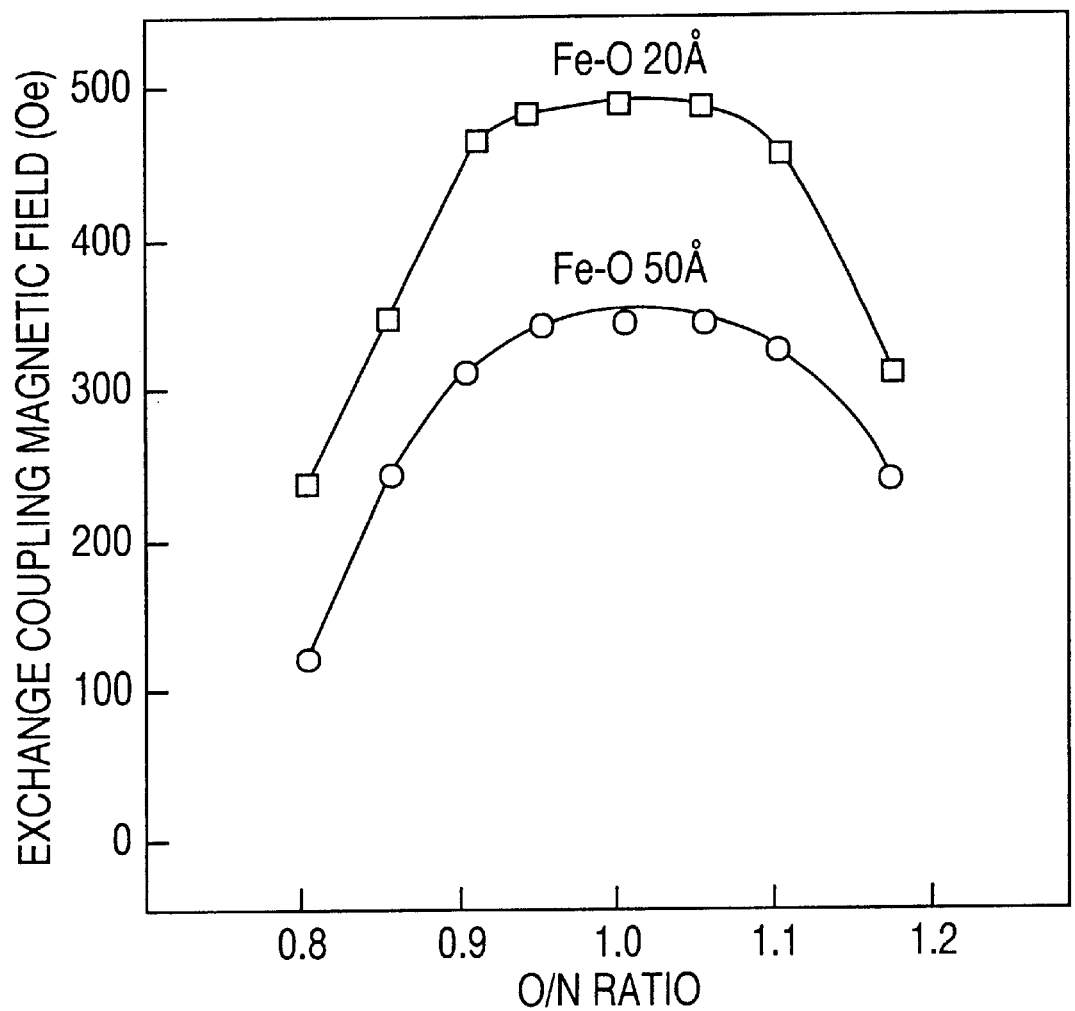
FIG. 13 is a graph which shows the dependency of the exchange coupling magnetic field on the O/Ni ratio in the magnetoresistive effect film which is shown in FIG. 1.

FIG. 13 shows the dependency of the exchange coupling magnetic field on the O/Ni ratio, from which it is seen that, for both of the Fe—O layer thicknesses shown, the exchange coupling magnetic field takes on a peak value when the O/Ni ratio is 0.9 to 1.1.

Figure 14:
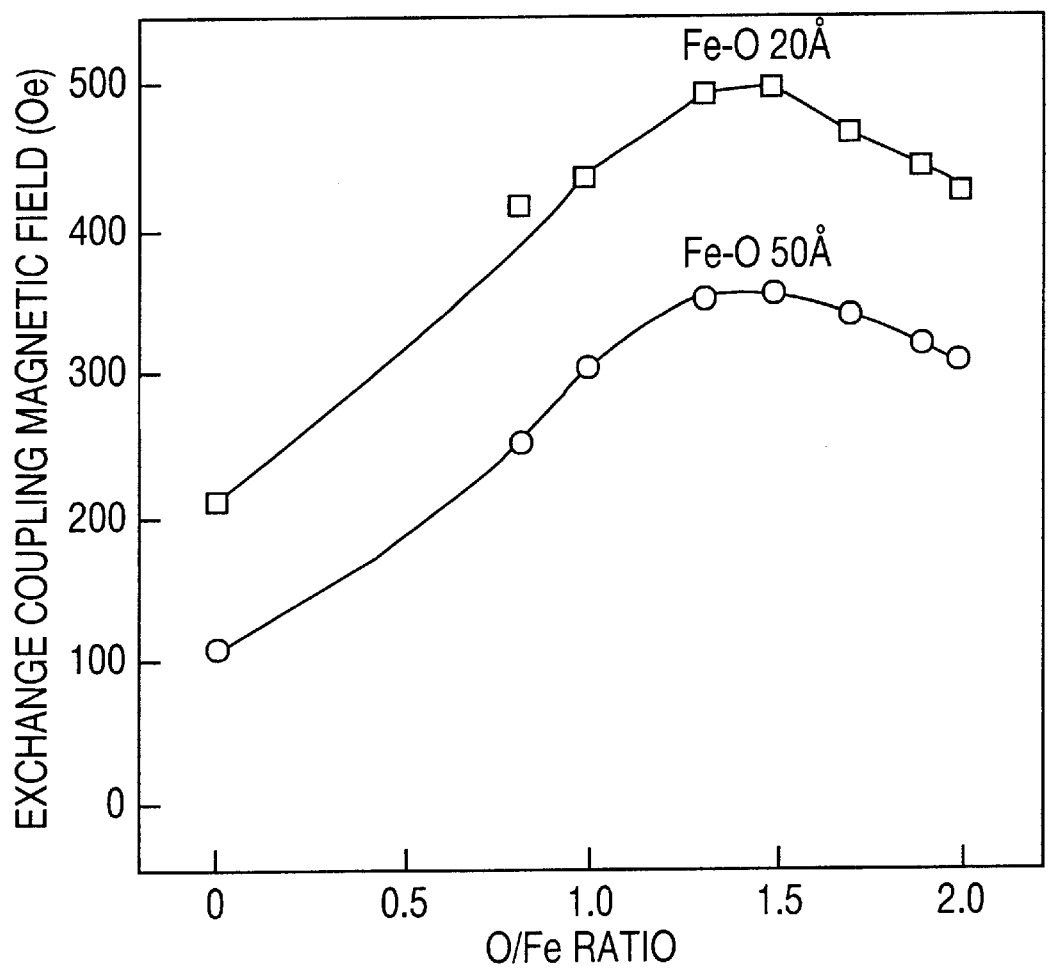
FIG. 14 is a graph which shows the dependency of the exchange coupling magnetic field on the O/Fe ratio in the magnetoresistive effect film which is shown FIG. 1.

FIG. 14 shows the dependency of the exchange coupling magnetic field on the O/Fe ratio, for which It is seen that the exchange coupling magnetic field takes on a peak value when the O/Fe ratio is 0.8 to 2.0.

Figure 15:
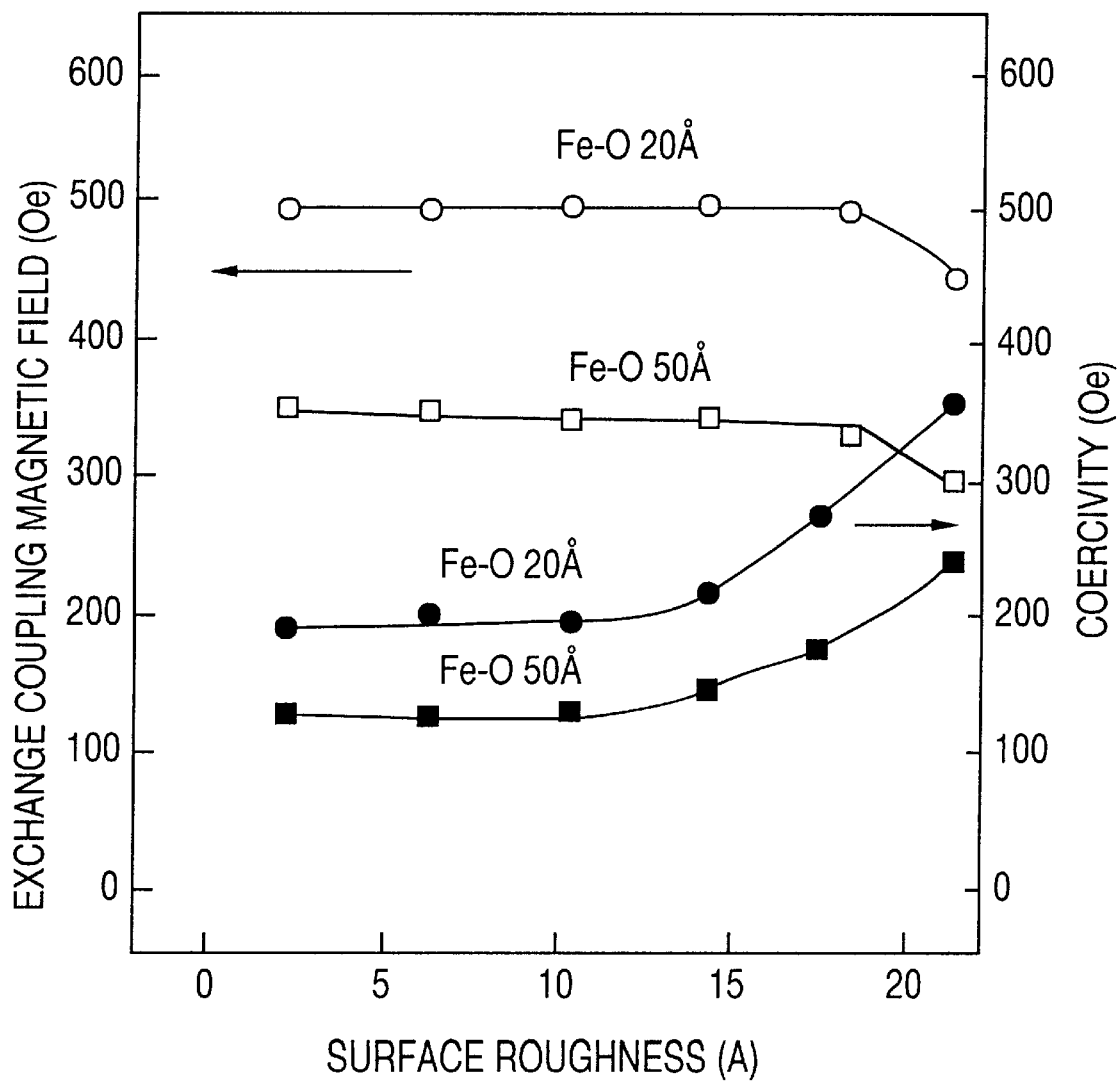
FIG. 15 is a graph which shows the dependency of the exchange coupling layers exchange coupling magnetic field and coercivity on the surface roughness of the antiferromagnetic thin film of the magnetoresistive effect film which is shown FIG. 1.

FIG. 15 shows the exchange coupling magnetic field of the exchange coupling layer and the coercivity, with respect to the surface roughness of the antiferromagnetic thin film.

The magnetic characteristics of the exchange coupling layer are related not only to the surface components of the antiferromagnetic thin film, but also to the surface roughness, and while the exchange coupling magnetic field is not much influenced by the surface roughness, the coercivity can be made small by making the surface roughness be 2 to 15 Å.

This is because the magnetic domain structure of the above-noted laminated magnetic films is influenced by the surface roughness, and MR characteristics which behave as a spin valve are obtained at a roughness of 2 to 15 Å.

Figure 16:
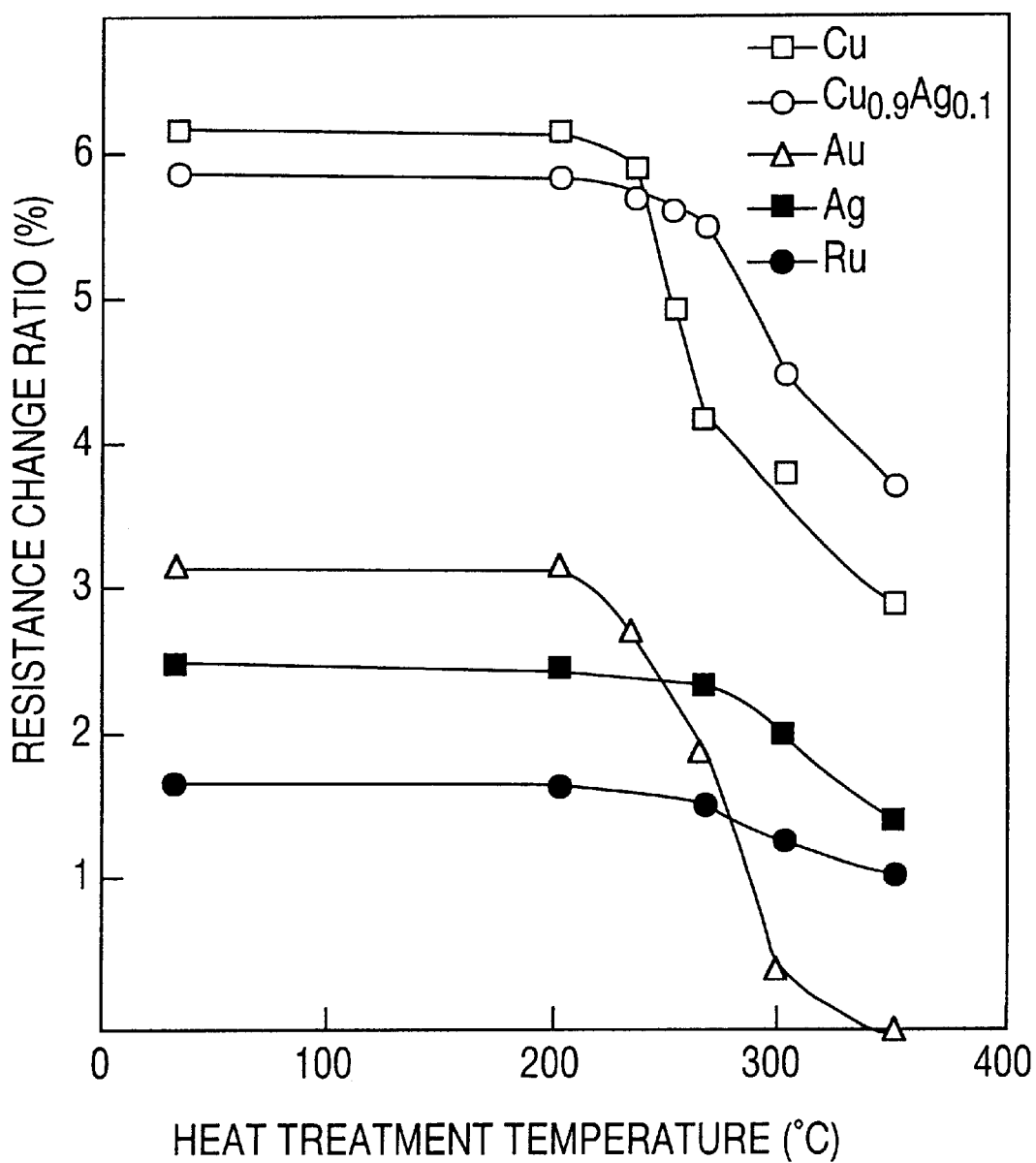
FIG. 16 is a graph which shows the dependency of the resistance change ratio on the heat treatment temperature of the magnetoresistive effect film which is shown in FIG. 1.

FIG. 16 shows the dependency of resistance change ratio on the heat treating temperature with various non-magnetic materials. It can be seen that by using a CuAg alloy or Ag as the non-magnetic material, the resistance change ratio can be maintained even with high-temperature heat treating.

This is because the alloying of nickel and copper is suppressed by precipitation of Ag at the crystal grain boundary.

Figure 17:
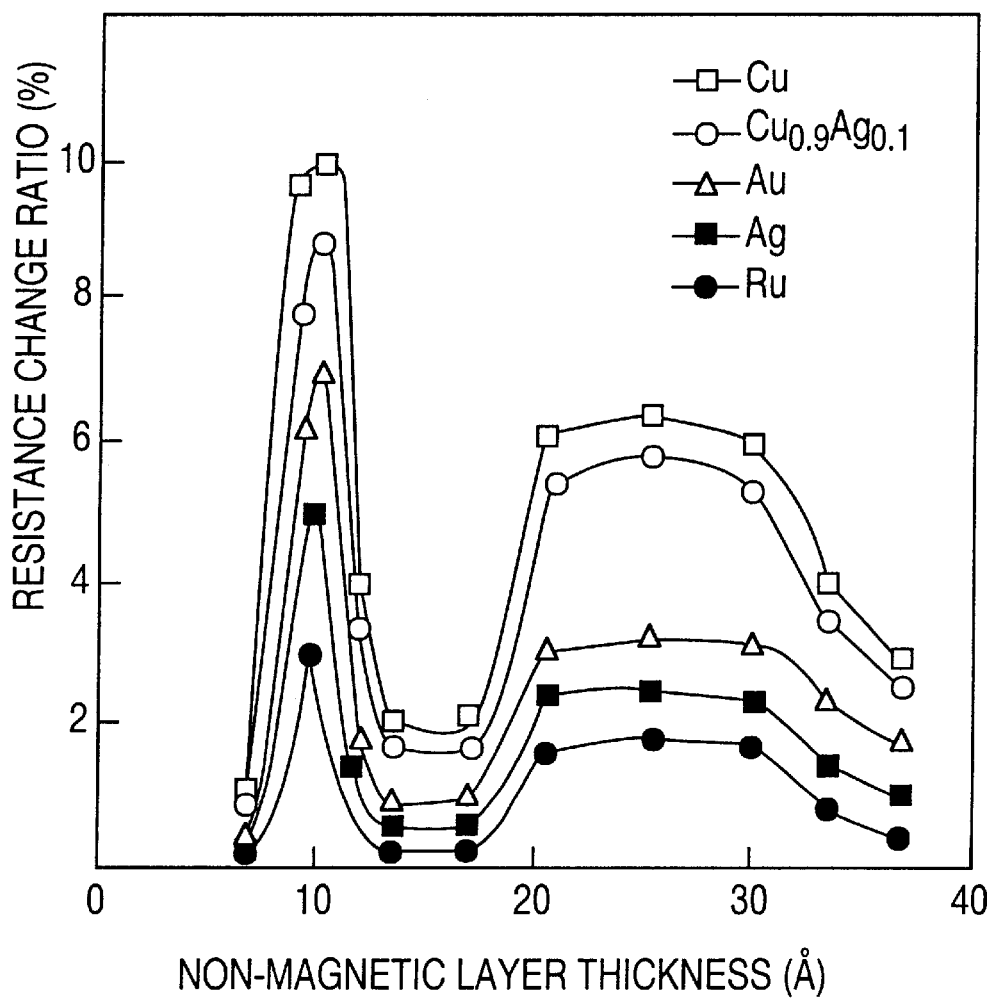
FIG. 17 is graph which shows the dependency of the resistance change ratio on the thickness of the antiferromagnetic thin film of the magnetoresistive effect film which is shown in FIG. 1.
Figure 18:
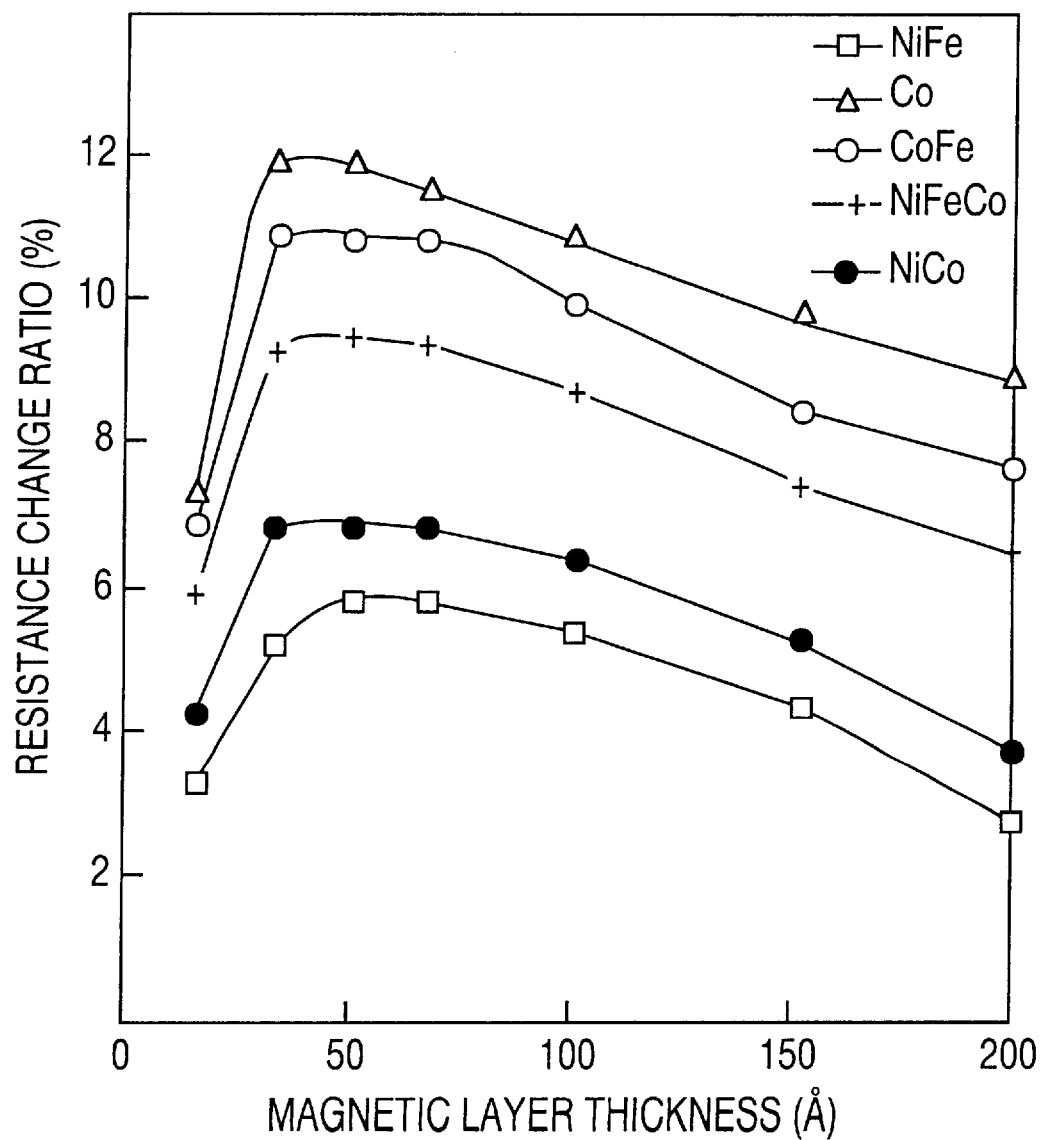
FIG. 18 is a graph which shows the dependency of the resistance change ratio on the thickness of the magnetic layer in the magnetoresistive effect film which is shown in FIG. 1.

FIG. 17 show the dependency of the resistance change ratio on the thickness of the non-magnetic layer.

With the spin valve film of the present invention, there are two peaks in the resistance charge ratio with respect to the the thickness of the non-magnetic layer, as shown in this graph.

This is because of the occurrence of antiferromagnetic interaction between the magnetic layers. With a non-magnetic layer thickness of 20 to 30 Å, the resistance change ratio is 6.5%, and with a thickness of 10 Å, it is approximately 10%.

FIG. 13 shows the dependency of the resistance change ratio on the thickness of the magnetic layer. With a magnetic layer thickness of 40 to 70 Å, the resistance change ratio is seen to exhibit a peak value.

By using a ferromagnetic material such as one based on cobalt, the electron dispersion probability at the boundary between the magnetic layer and the non-magnetic layer increases, enabling achievement of a good resistance change ratio (of 12%).

Figure 19:
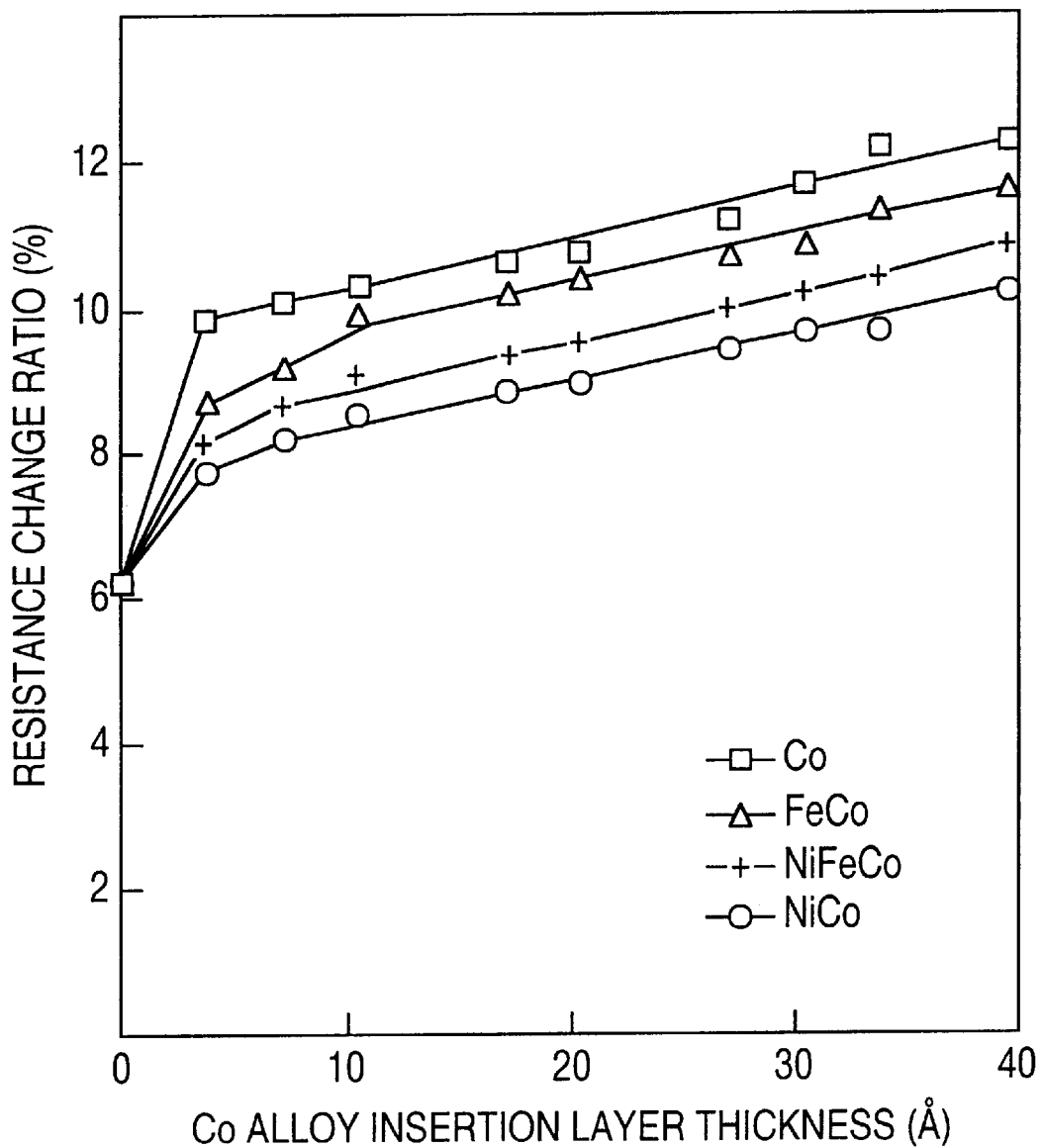
FIG. 19 is a graph which shows the dependency of the resistance change ratio on the thickness of the inserted cobalt alloy layer in the magnetoresistive effect film which is shown in FIG. 1.

FIG. 19 shows the dependency of the resistance change ratio on the thickness of a cobalt-based alloy (Co, FeCo, NiCo, NiFeCo) when such as layer is inserted at the boundary between the magnetic layer and the non-magnetic layer.

An effect is seen when an alloy having a thickness of several Angstrom is inserted, and at 10 Å or greater it can be seen that there is a gradual increase in the resistance change ratio.

Under these conditions, the coercivity of the magnetic layer that senses the magnetic field is approximately 15 Oe for cobalt inserted with a thickness of 30 Å, resulting in a tendency for hysteresis occurring in the MR characteristics of the spin valve film.

Figure 20:
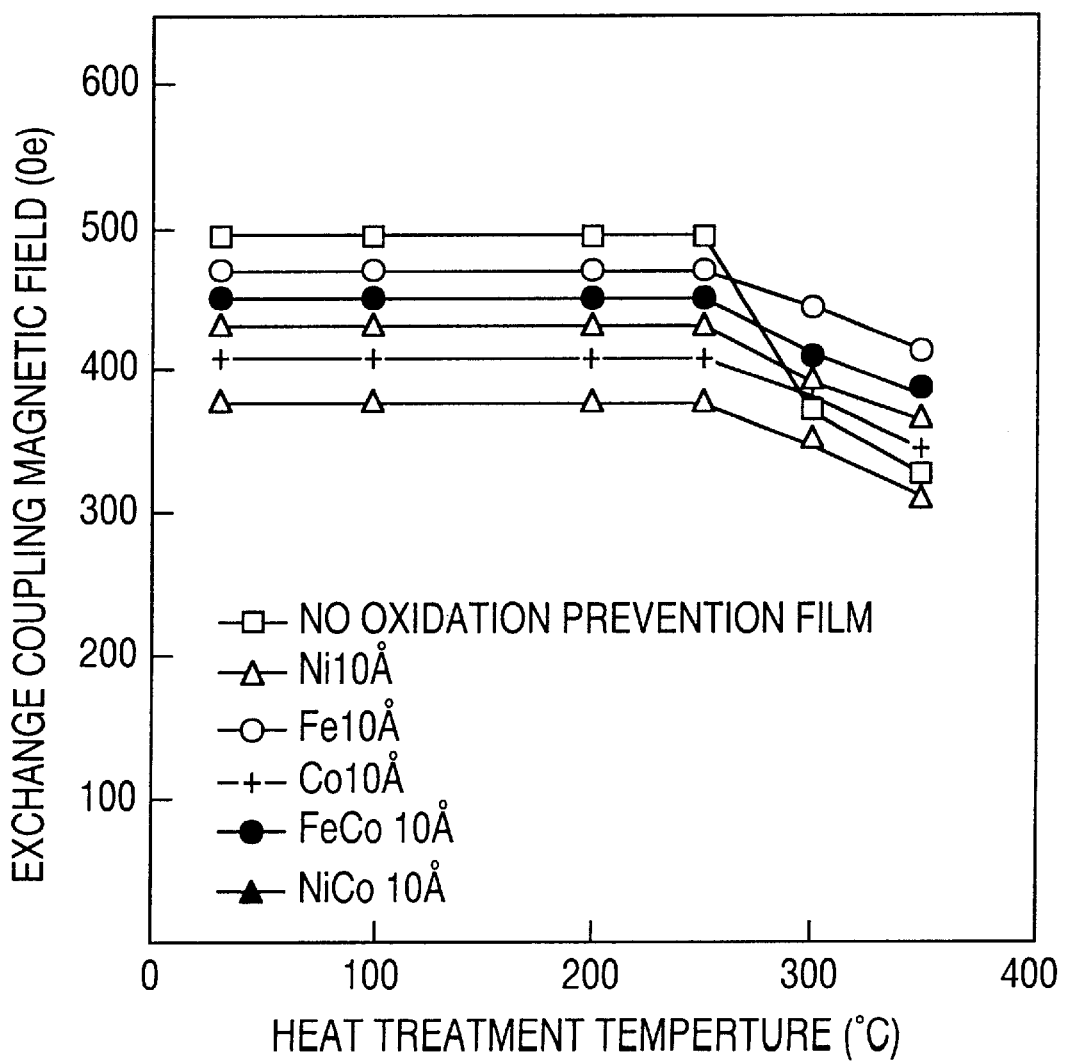
FIG. 20 is a graph which shows the dependency of the exchange coupling magnetic field on the heat treatment temperature in the magnetoresistive effect film which is shown in FIG. 1.

FIG. 20 shows the dependency of the exchange coupling magnetic field on the heat treating temperature for the case in which there iron, nickel, cobalt or an alloy thereof inserted at the boundary between the antiferromagnetic thin film and the magnetic film.

Figure 21:
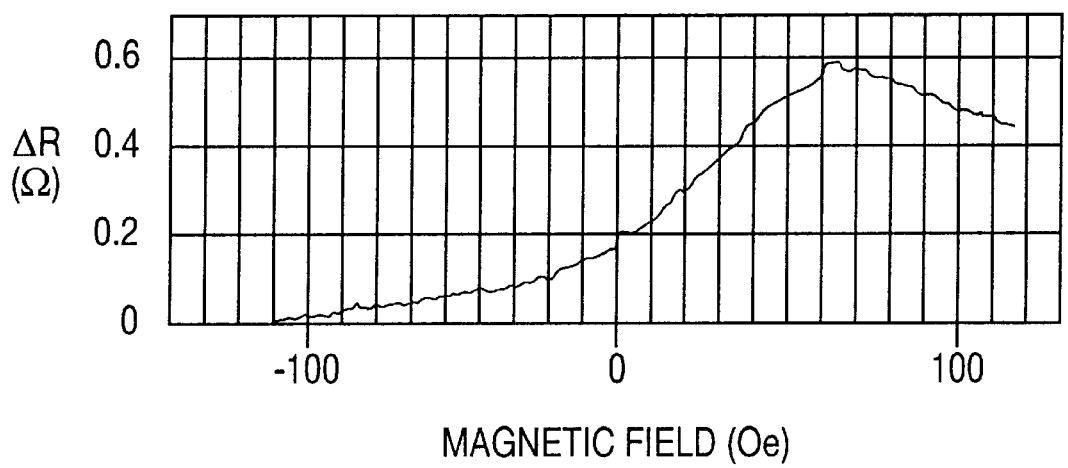
FIG. 21 is a graph which shows the MR curve of a magnetoresistive effect element that is formed from the magnetoresistive effect film which is shown in FIG. 1.

By inserting a oxidation preventing film between the oxide antiferromagnetic thin film and the magnetic film, the reduction of the magnitude of the exchange coupling magnetic field caused by oxidation of the magnetic layer is suppressed, an exchange coupling magnetic field of 400 Oe being maintained even with respect to a heat treating temperature of 300° C., FIG. 21 shows the MR curve of the element, wherein the element height of the spin valve film in the present invention is 1 μm, the element width being 1.2 μm, and with a CoCrPt permanent magnet film being used as an adjacent magnetic domain stabilizing film. From this, it can be seen that it is possible to stabilize the magnetic domains by using a permanent magnet film, not only avoiding a non-linear output due to a Barkhausen jump, but also achieving and output that is increased by 6 to 10 fold compared with the normal anisotropic magnetoresistive effect.

Typical B-H curves and MR curves for a spin valve according to the present invention are shown in FIG. 5 through FIG. 8.

It is possible to configure the following magnetoresistive effect elements using a magnetoresistive effect film according to the present invention.

(a) A magnetoresistive effect element wherein microprocessing is done to a magnetoresistive effect film according to the present invention, this creating an element height of 0.5 to 1.5 μm, and detected current density of $0.5 \times 10^7 \sim 5 \times 10^7$ A/cm$^2$, when the magnetic field is detected.

(b) A shielded magnetoresistive effect sensor having a structure wherein the top and bottom of the magnetoresistive effect element of (a) are sandwiched via an insulating layer, using a high-permeability soft magnetic material.

(c) A yoke-tape magnetoresistive sensor having a structure wherein the signal magnetic field is guided to the magnetoresistive effect element of (a) by a high-permeability soft magnetic material.

(d) A magnetoresistive detection system having both the magnetoresistive effect element of (a), and means for detecting the resistance change ratio of the above-noted magnetoresistive effect element as a function of the detected magnetic field.

According to a magnetoresistive effect film and a method of manufacturing therefor according to the present invention, it is possible to obtain characteristics which exhibit a large linear change in resistance in the region of zero magnetic field, and further to improve the immunity to corrosion and heat.

What is claimed is:

1. A magnetoresistive effect film comprising, at least as laminated elements:

an antiferromagnetic thin film;

a first magnetic thin film that is in contact with said antiferromagnetic thin film;

a non-magnetic thin film that is in contact with said first magnetic thin film; and a second magnetic thin film that is in contact with said non-magnetic thin film, a bias magnetic field of said antiferromagnetic thin film Hr and a coercivity of said second magnetic thin film Hc2 being such that the condition Hc2<Hr is satisfied, said antiferromagnetic thin film being formed by the lamination of a nickel oxide film and an iron oxide film having a thickness of 20 to 100 Å, and the composition ratio of oxygen with respect to nickel in said nickel oxide film is 0.9 to 1.1.

2. A magnetoresistive effect film according to claim 1, wherein thickness of said nickel oxide film is 150 to 500 Å.

3. A magnetoresistive effect film according to claim 1, wherein the material of said non-magnetic thin film is one or more materials selected from a group consisting of Au, Ag, Cu, and Ru.

4. A magnetoresistive effect film according to claim 1, wherein the bias magnetic field of said antiferromagnetic thin film Hr, the coercivity of said second magnetic thin film Hc2, and an anisotropic magnetic field is Hk2 are such that the condition Hc2(Hk2<Hr is satisfied.

5. A magnetoresistive effect film according to claim 1, wherein the material of said first or said second magnetic thin film is one or more selected from a group consisting of Ni, Fe, Co. FeCo, NiFe, and NiFeCo.

6. A magnetoresistive effect film according to claim 1, wherein the thickness of said first or said second magnetic thin film is 10 to 150 Å.

7. A magnetoresistive effect film according to claim 1, wherein Co, FeCo, NiCo or NiFeCo is inserted with a thickness of 3 to 40 Å at the boundary between said non-magnetic thin film and said first or said second magnetic thin film.

8. A magnetoresistive effect film according to claim 1, wherein one or more materials selected from a group consisting of Fe, Ni, and Co is inserted with a thickness of 3 to 30 Å at the boundary between said antiferromagnetic thin film and said first magnetic thin film.

9. A magnetoresistive effect film comprising, at least as laminated elements:

an antiferromagnetic thin film;

a first magnetic thin film that is in contact with said antiferromagnetic thin film; and a non-magnetic thin film that is in contact with said first magnetic thin film; and a second magnetic thin film that is in contact with said non-magnetic thin film, a bias magnetic field of said antiferromagnetic thin film Hr and a coercivity of said second magnetic thin film Hc2 being such that the condition Hc2<Hr is satisfied, said antiferromagnetic thin film being formed by the lamination of a nickel oxide film and an iron oxide film having a thickness of 20 to 100 Å, and the composition ratio of oxygen with respect to iron in said iron oxide film is 0.8 to 2.0.

10. A magnetoresistive effect film according to claim 9, wherein thickness of said nickel oxide film is 150 to 500 Å.

11. A magnetoresistive effect film according to claim 9, wherein the material of said non-magnetic thin film is one or more materials selected from a group consisting of Au, Ag, Cu, and Ru.

12. A magnetoresistive effect film comprising, at least as laminated elements:

an antiferromagnetic thin film;

a first magnetic thin film that is in contact with said antiferromagnetic thin film;

a non-magnetic thin film that is in contact with said first magnetic thin film; and a second magnetic thin film that is in contact with said non-magnetic thin film, a bias magnetic field of said antiferromagnetic thin film Hr and a coercivity of said second magnetic thin film Hc2 being such that the condition Hc2<Hr is satisfied, said antiferromagnetic thin film being formed by the lamination of a nickel oxide film and an iron oxide film having a thickness of 20 to 100 Å, and the crystalline structure of said iron oxide film has $\alpha$-Fe2O3 as its major component.

13. A magnetoresistive effect film according to claim 12, wherein thickness of said nickel oxide film is 150 to 500 Å.

14. A magnetoresistive effect film according to claim 12, wherein the material of said non-magnetic thin film is one or more materials selected from a group consisting of Au, Ag, Cu, and Ru.

15. A magnetoresistive effect film comprising, at least as laminated elements:

an antiferromagnetic thin film;

a first magnetic thin film that is in contact with said antiferromagnetic thin film;

a non-magnetic thin film that is in contact with said first magnetic thin film; and a second magnetic thin film that is in contact with said non-magnetic thin film, a bias magnetic field of said antiferromagnetic thin film Hr and a coercivity of said second magnetic thin film Hc2 being such that the condition Hc2<Hr is satisfied, said antiferromagnetic thin film being formed by the lamination of a nickel oxide film and an iron oxide film having a thickness of 20 to 100 Å, and the crystalline structure of said iron oxide film has FeO as its major component.

16. A magnetoresistive effect film according to claim 15, wherein thickness of said nickel oxide film is 150 to 500 Å.

17. A magnetoresistive effect film according to claim 15, wherein the material of said non-magnetic thin film is one or more materials selected from a group consisting of Au, Ag, Cu, and Ru.

18. A magnetoresistive effect film comprising, at least as laminated elements:

an antiferromagnetic thin film;

a first magnetic thin film that is in contact with said antiferromagnetic thin film;

a non-magnetic thin film that is in contact with said first magnetic thin film; and a second magnetic thin film that is in contact with said non-magnetic thin film, a bias magnetic field of said antiferromagnetic thin film Hr and a coercivity of said second magnetic thin film Hc2 being such that the condition Hc2<Hr is satisfied, said antiferromagnetic thin film being formed by the lamination of a nickel oxide film and an iron oxide film having a thickness of 20 to 100 Å, and the surface roughness of said antiferromagnetic thin film is 2.0 to 15 Å.

19. A magnetoresistive effect film according to claim 18, wherein thickness of said nickel oxide film is 150 to 500 Å.

20. A magnetoresistive effect film according to claim 18, wherein the material of said non-magnetic thin film is one or more materials selected from a group consisting of Au, Ag, Cu, and Ru.

* * * * *